United States Patent
Lai et al.

(10) Patent No.: US 7,685,558 B2
(45) Date of Patent: Mar. 23, 2010

(54) METHOD FOR DETECTION AND SCORING OF HOT SPOTS IN A DESIGN LAYOUT

(75) Inventors: Chih-Ming Lai, Hsin-Chu (TW); Ru-Gun Liu, Hsin-Chu (TW); I-Chang Shin, Hsin-Chu (TW); Yao-Ching Ku, Hsin-Chu (TW); Cliff Hou, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 245 days.

(21) Appl. No.: 11/682,640

(22) Filed: Mar. 6, 2007

(65) Prior Publication Data

US 2007/0266362 A1 Nov. 15, 2007

Related U.S. Application Data

(60) Provisional application No. 60/800,526, filed on May 15, 2006.

(51) Int. Cl.
*G06F 17/50* (2006.01)

(52) U.S. Cl. .................. 716/19; 716/2; 716/11

(58) Field of Classification Search .............. 716/2, 716/11, 19
See application file for complete search history.

(56) References Cited

U.S. PATENT DOCUMENTS

| | | | |
|---|---|---|---|
| 5,847,965 A | 12/1998 | Cheng | |
| 6,077,310 A | 6/2000 | Yamamoto et al. | |
| 6,408,219 B2 | 6/2002 | Lamey, Jr. et al. | |
| 7,363,207 B2 | 4/2008 | Kamon | |
| 2005/0044514 A1 | 2/2005 | Wu et al. | |
| 2005/0132306 A1 | 6/2005 | Smith et al. | |
| 2006/0026539 A1 | 2/2006 | Tetelbaum et al. | |
| 2006/0123380 A1 | 6/2006 | Ikeuchi | |
| 2006/0266833 A1* | 11/2006 | Nehmadi et al. | 235/454 |
| 2007/0055892 A1 | 3/2007 | Pikus | |
| 2007/0201442 A1 | 8/2007 | Hekmatpour et al. | |
| 2007/0234246 A1 | 10/2007 | Sinha et al. | |
| 2007/0266356 A1 | 11/2007 | Chang et al. | |
| 2007/0266362 A1 | 11/2007 | Lai et al. | |
| 2007/0288219 A1* | 12/2007 | Zafar et al. | 703/14 |

OTHER PUBLICATIONS

Charles Ouyang et al., An Analytical Model of Multiple ILD Thickness Variation Induced by Interaction of Layout Pattern and CMP Process, IEEE Transactions on Semiconductor Manufacturing, Aug. 2000, 7 pages.

(Continued)

*Primary Examiner*—Thuan Do
(74) *Attorney, Agent, or Firm*—Haynes and Boone, LLP

(57) ABSTRACT

A method for detection and scoring of hotspots in a design layout is provided. A plurality of indices is derived for a plurality of positions in the design layout. The plurality of indices comprises a first index sensitive to energy exposure of the design layout, a second index sensitive to process image formation, and a third index sensitive to mask manufacturing error. The plurality of indices is then analyzed to identify at least one hotspot in the design layout. The at least one hotspot is then prioritized using an integrated hotspot scoring system. The integrated hotspot scoring system prioritizes hotspots based on a look-up table approach or an interpolation approach.

16 Claims, 14 Drawing Sheets

OTHER PUBLICATIONS

Raghevndra, Srinivas et al., "DFM: Linking Design and Manufacturing," Proceedings of the 18$^{th}$ International Conference on VLSI Design Held Jointly with 4$^{th}$ International Conference on Embedded Systems Design, VLSID, 2005, pp. 705-708.

Tsujikawa, Hiroyuki et al., "Power-Supply Noise Reduction with Design for Manufacturability," IEICE Trans Fundamentals, vol. E88-A, No. 12, Dec. 2005, pp. 3421-3428.

Chappell, Jeff, "The Future is the FOUP—Company Business and Marketing," Electronic News, Jul. 17, 2000, 2 pages.

Chen, Kuan-Chou, et al., "Integrated Circuits Industry / Front-Opening Unified Pod Audo-Loading Structure," Knowledge Bridge, No. 22, Apr. 2002, 4 pages.

Ottesen, Craig, "Front Opening Pod (FOUP) Fire Protection: A General Overview", Inteternational Sematech, Nov. 5, 1999, 10 pages.

\* cited by examiner

Fig. 6
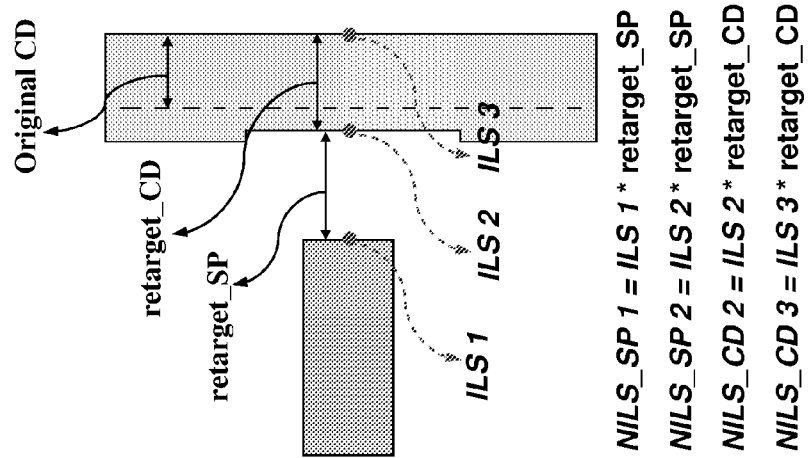
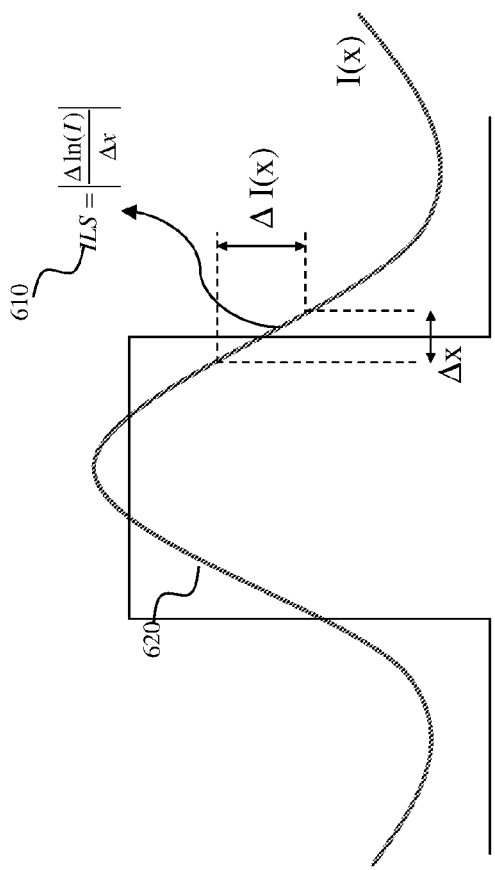
$$NILS\_CD = \left|\frac{\Delta \ln(I)}{\Delta x}\right| * \text{retarget\_CD}$$
$$NILS\_SP = \left|\frac{\Delta \ln(I)}{\Delta x}\right| * \text{retarget\_SP}$$

Fig. 7

$$710 \sim DOF\_CD = df * \left( \left| \frac{\text{retarget}\_CD * CD\_tor}{CD_{f0} - CD_{+df}} \right| + \left| \frac{\text{retarget}\_CD * CD\_tor}{CD_{f0} - CD_{-df}} \right| \right)$$

$$720 \sim DOF\_SP = df * \left( \left| \frac{\text{retarget}\_SP * SP\_tor}{SP_{f0} - SP_{+df}} \right| + \left| \frac{\text{retarget}\_SP * SP\_tor}{SP_{f0} - SP_{-df}} \right| \right)$$

Fig. 9

$910$ ~ DOF_CD = ( df_slope ( ( |CD_tor| − |ΔCD$_{+df}$| ) + df ) +
( df_slope ( ( |CD_tor| − |ΔCD$_{-df}$| ) + df )

$920$ ~ df_slope = df_slope_mean/sqrt( |df_dCD| )

Fig. 11

$$1110 \sim MEEF = \frac{Contour\_CD\_bias}{2*mask\_edge\_bias}$$

Fig. 13

1320 / 1330 / 1340 / 1350 — Integrated hot-spot combination

| | hot-spot level definition | score index | g1 | g2 | g3 | g4 | g5 | g6 | g7 | g8 | g9 | g10 | g11 | g12 | g13 | g14 | g15 | g16 | g17 | g18 | g19 | g20 | g21 | g22 | g23 | g24 | g25 | g26 |
|---|---|---|---|---|---|---|---|---|---|---|---|---|---|---|---|---|---|---|---|---|---|---|---|---|---|---|---|---|
| NILS | level1 : <= spec A | 8 | 1 | | | | | | | | | | | | | | | | | | | | | | | | | |
| | level2 : spec A < & <= spec B | 2 | | 1 | | | | | 1 | | | | | | 1 | | | | | 1 | | | 1 | | 1 | | | | |
| DOF | level1 : <= spec A | 5 | | | 1 | | | | | 1 | | | 1 | | | 1 | | | 1 | | | | | | | 1 | | | |
| | level2 : spec A < & <= spec B | 2 | | | | 1 | | | | | 1 | | | 1 | | | 1 | | | 1 | | | 1 | | | | 1 | | 1 |
| MEEF | level1 : >= spec A | 2 | | | | | 1 | | 1 | | | 1 | | | 1 | | | 1 | | | 1 | | | 1 | | | | 1 | 1 |
| | level2 : spec A > & >= spec B | 1 | | | | | | 1 | | | | | 1 | 1 | 1 | 1 | 1 | 1 | | | | 1 | 1 | 1 | 1 | 1 | 1 | | |

1360

| score index of integrated hot-spot | 8 | 2 | 5 | 2 | 2 | 1 | 13 | 10 | 7 | 3 | 7 | 4 | 4 | 3 | 7 | 6 | 4 | 3 | 15 | 14 | 12 | 11 | 9 | 8 | 6 | 5 |
|---|---|---|---|---|---|---|---|---|---|---|---|---|---|---|---|---|---|---|---|---|---|---|---|---|---|---| can be waived / level 3

| | | | | | | | | | | | | | | | |
|---|---|---|---|---|---|---|---|---|---|---|---|---|---|---|---|
| hot-spot flag level | 0 | 1 | 2 | 3 | 4 | 5 | 6 | 7 | 8 | 9 | 10 | 11 | 12 | 13 | 14 | 15 |
| hot-spot index | 0 | 1 | 3 | 2 | 3 | 2 | 2 | 2 | 2 | 2 | 2 | 1 | 1 | 1 | 1 | 1 |
| hot-spot type No. | | | | | | | | | | | | | | | | |

1310

| NILS spec A | 1.5 |
|---|---|
| NILS spec B | 2.5 |
| DOF spec A | 0.175 |
| DOF spec B | 0.24 |
| MEEF spec A | 4 |
| MEEF spec B | 2.8 |

1300 / 1370

METHOD FOR DETECTION AND SCORING OF HOT SPOTS IN A DESIGN LAYOUT

CROSS-REFERENCE

This patent claims the benefit of U.S. Application No. 60/800,526 filed May 15, 2006, the contents of which are hereby incorporated by reference.

BACKGROUND

In semiconductor manufacturing, a design layout of a wafer pattern is typically checked or verified to determine whether the layout meets certain design specification requirements. In particular, the design layout is checked against a plurality of design rules to determine whether the layout properly complies with these rules. Currently, utilities that check design rules utilize very simply or basic comparisons, such as comparing a feature width to a minimum width requirement or comparing a spacing between different features to a minimum spacing requirement. However, a design layout that satisfies the design rules may still be subject to certain hot spots, or potential sources of defect. Therefore, a need exists for a method that checks a design layout for additional problem areas, such as hot spots.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6 illustrates formulas for deriving normalized intensity log slope (NILS) and positions in the wafer pattern for evaluating NILS.

FIG. 7 illustrates formulas for deriving depth of focus (DOF) using a basic estimation approach.

FIG. 9 illustrates formulas for deriving depth of focus (DOF) using an advanced estimation approach.

FIG. 11 illustrates a formula for deriving mask error enhancement factor (MEEF).

FIG. 13 illustrates an exemplary lookup table approach of the integrated hotspot scoring system.

DETAILED DESCRIPTION

Figure 1:
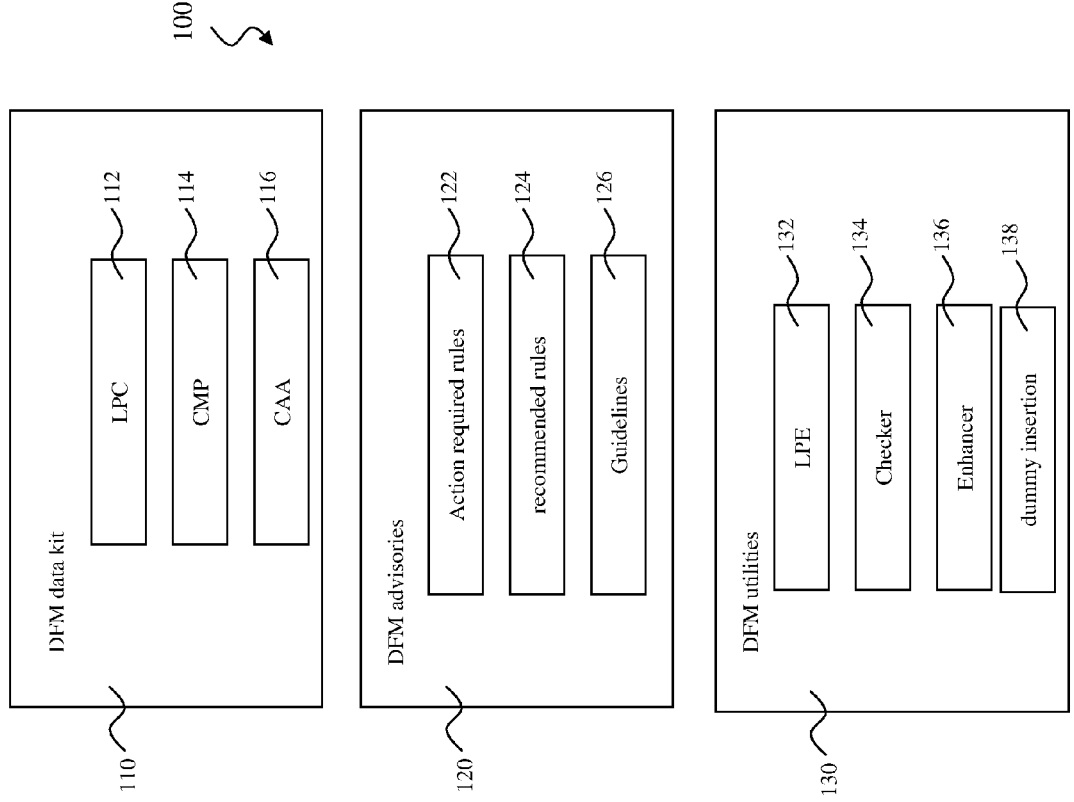
FIG. 1 illustrates an exemplary DFM (or DFM tool kit).

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Design for manufacturability, or DFM, is an integration of manufacturing data and design procedure for better yield and design efficiency. An interaction and communication between designer and manufacturer is enhanced thereby for more accurate, faster, and more efficient design. In one example, various manufacturing data are formulated, quantified, and integrated to enable collaboration between manufacturer and designer, reduce design time and design cost, and increase manufacturing yield and production performance. DFM can be realized at various design stages with collaboration of design tool vendors. The manufacturer may include a semiconductor foundry. The designer may include an integrated circuit (IC) design house. The design tool vendor may include an electronic design automation (EDA) tool vendor.

DFM includes various functional modules and/or steps to enhance IC design. These modules are typically provided as computer software that is stored on memory and executed on one or more computers. For example, the IC design house may produce an IC design that is then provided to a computer that is running DFM software provided by an EDA tool vendor. The computer executes one or more modules described below and provides the results back to the IC design house. In a further example, the EDA tool vendor may be associated with, or part of, the manufacturer.

FIG. 1 illustrates an exemplary DFM (or DFM tool kit) 100 which includes a DFM data kit (DDK) 110. Manufacturing data, such as processing recipes, tool characterization, manufacturing environment, production and processing statistical information, and IC testing and measurement data, are compiled, accumulated, and formulated to form the DDK and provide a manufacturing simulation such as lithography process check (LPC) simulation 112, chemical mechanical polishing (CMP) simulation 114, and/or critical area analysis (CAA) simulation 116. In LPC simulation 112, a lithography process can be simulated for a design layout by implementing DDK. Various failure areas, defect areas, or weak areas associated with the manufacturing process, referred to as hotspots, can be identified for further design tuning.

In the CMP simulation 114, a CMP process is simulated to a design layout by utilizing DDK 110. The design layout is converted to a material thickness and thickness hotspots can be identified for further design tweaking and tuning. CAA simulation 116 utilizes DDK for critical area identification and design improvement. DDK 110 can be provided to an IC design vendor and be integrated into a design tool, or directly distributed to a designer such as a fab-less design house and employed by the designer in a design tool. DFM 100 also includes DFM advisories 120.

The DFM advisories 120 are extracted from the manufacturing information and provided for an IC design tool and/or a designer. The DFM advisories 120 further include DFM rules that can be incorporated into a design tool for checking any violation. DFM rules such as action required rules 122 are binding, requiring further actions to eliminate the associated violation. Recommended rules 124 are not binding and suggested for design improvement. The DFM advisories also include guidelines 146, provided for the designer to follow in implementing an IC design procedure.

DFM 100 also includes DFM utilities 130, utilizing DDK 110 and DFM advisories 120 in IC design. DFM utilities 130 may be integrated into a design tool and incorporated into a design flow. For example, dummy insertion may be implemented at the place-and-route design stage so that dummy features are automatically generated in the IC layout to reduce CMP manufacturing variances. DFM utilities 130 may provide corrective actions and solutions to the designer to guide for design improvement and tuning. For example, DFM utilities 130 may provide a solution to eliminate identified hotspots from a lithography process simulation, such as reconfiguring metal lines to eliminate the hotspots. In one embodiment, DFM utilities 130 include a layout parasitic extraction (LPE) deck 132 for extracting more accurate parasitic parameters such as parasitic resistance and capacitance with the manufacturing data such as CMP data, and further for providing suggested actions to adjust parasitic parameters and timing.

DFM utilities 130 may also include a checker 134 that is integrated with DFM rules, is able to automatically check the layout for any DFM rule violation, and/or provides suggestions to eliminate the violation. DFM utilities 130 may include an enhancer 136 that is capable of automatically adjusting the layout to meet the DFM rules or eliminate identified hotspots. DFM utilities 130 may further include a dummy insertion module 138 to incorporate dummy insertion into a design layout.

DFM 100 provides model-based utilities from various simulations and rule-based utilities from DFM advisories. DFM 100 can be implemented at various designing stages and certain manufacturing stages. For example, dummy insertion may be implemented at place-and-route step such that the dummy features are included in a layout at early design stage. LPE deck may be implemented at extraction and a timing simulation. LPC may be implemented before the tape-out. Alternatively, LPC may be implemented after the tape-out. In this situation, the layout can be adjusted to eliminate hotspots identified by LPC before fabricating a mask of the layout in a mask shop.

DFM LPC is a model-based approach which can simulate a wafer pattern of a design layout. DFM-LPC can cover various layout environment which cannot be achieved by current DRC utilities, for example, more complex design layouts. DFM LPC also provides a mechanism of defining hotspots. Based on the results generated by the DFM LPC model, designers may modify the design layout to become more friendly to manufacturing.

To identify weak areas or hotspots in a circuit design layout, various indexes and integrated hotspot scoring systems may be employed. In an illustrative embodiment, aspects of the present disclosure provide three indices and an integrated hotspot scoring system for detection and scoring of hotspots. The three indices include normalized intensity log slope (NILS), depth of focus (DOF), and mask error enhancement factor (MEEF) since these three indices are sensitive to process variations. The NILS index is sensitive to exposure energy variation. High exposure energy often causes the wafer dimension to be unstable.

The DOF index is sensitive to process image formation or topography of the wafer surface. The higher the DOF index, the better the topography and wafer dimension control. The MEEF index is sensitive to mask manufacturing error. The lower the MEEF index, less error is encountered during mask manufacturing. The MEEF index becomes more sensitive as the dimension of the wafer reduces. The MEEF index is provided by the manufacturing data.

Figure 2:
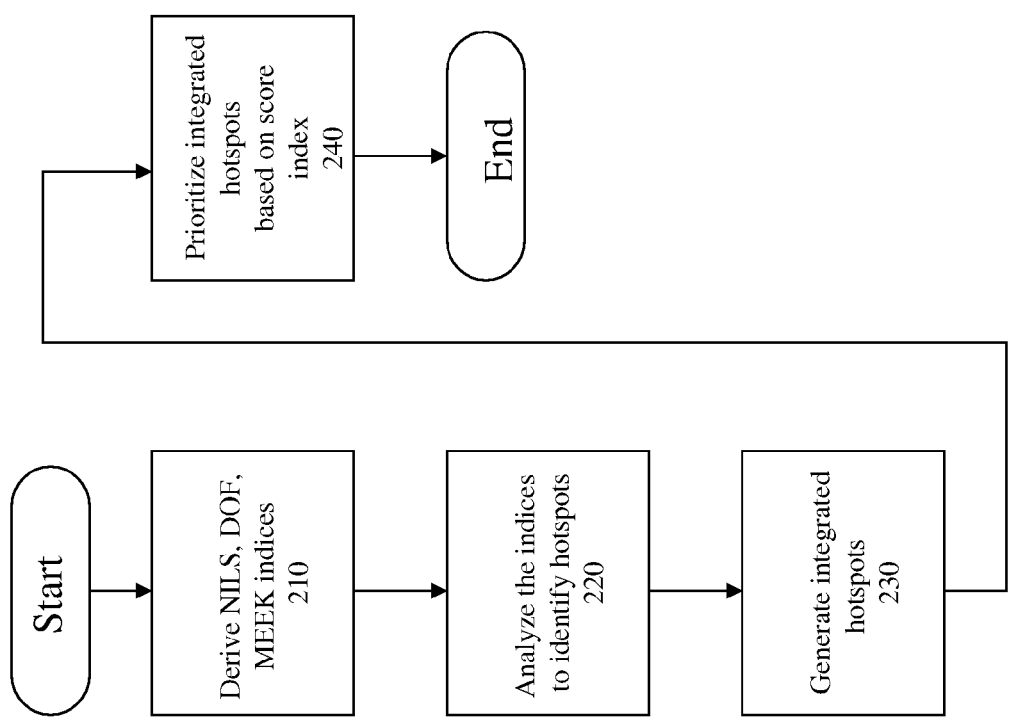
FIG. 2 is a flowchart of a method for detection and scoring of hotspots in a design layout.

FIG. 2 is a flowchart of a method for detection and scoring of hotspots in a design layout. At step 210, the process begins to derive the NILS, DOF, and MEEF indices provided in the present disclosure. More details regarding how to derive the NILS, DOF, and MEEF indices are discussed below with reference to FIG. 3. At step 220, the process proceeds to analyze the NILS, DOF, and MEEF indices to identify hotspots. At step 230, the process proceeds to generate integrated hotspots using the indices. Steps 220 and 230 may be performed using two exemplary approaches: a look-up table approach and an interpolation approach. More details regarding the look-up table approach and the interpolation approach are discussed below with reference to FIGS. 4 and 5 respectively. At step 240, the integrated hotspots are prioritized based on a score index. The process then terminates thereafter.

Figure 3:
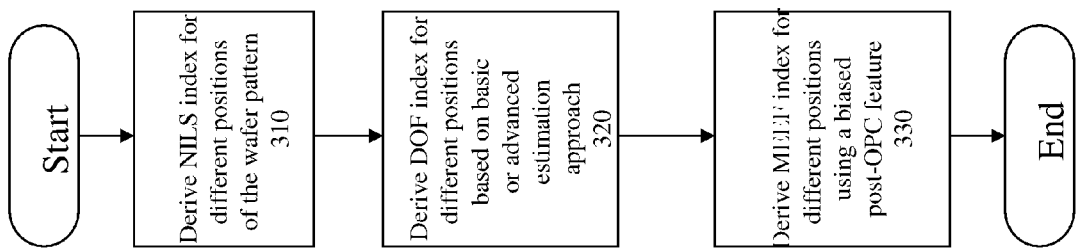
FIG. 3 is a flowchart of a method for deriving the NILS, DOF, and MEEF indices.

FIG. 3 is a flowchart of a method for deriving the NILS, DOF, and MEEF indices. At step 310, the process begins to derive the NILS index for different positions of the wafer pattern that are under evaluation. More details regarding how to derive the NILS index are discussed below with reference to FIG. 6. At step 320, the process proceeds to derive the DOF index for the different positions based on a basic or advanced estimation approach. More details regarding how to derive the DOF index are discussed below with reference to FIGS. 7-10. At step 330, the process proceeds to derive MEEF index for the different positions using a biased post-OPC feature. More details regarding how to derive the MEEF index are discussed below with reference to FIGS. 11-12. The process then terminates thereafter.

Figure 4:
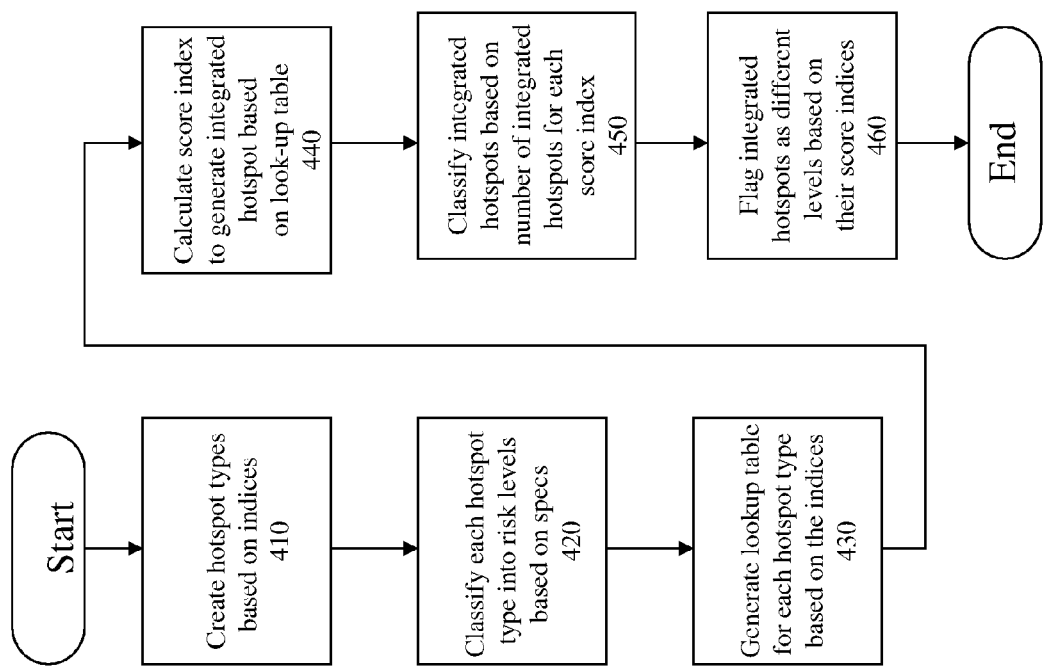
FIG. 4 is a flowchart of a look-up table approach.

FIG. 4 is a flowchart of a look-up table approach. At step 410, the process begins to create hotspot types based on the derived indices. At step 420, the process proceeds to classify each hotspot type into risk levels based on the specifications of the pattern type. At step 430, the process proceeds to generate a look-up table for each hotspot type based on the derived indices. At step 440, the process proceeds to calculate a score index to generate integrated hotspot based on the look-up table. At step 450, the process proceeds to classify integrated hotspots based on the number of integrated hotspots for each score index. At step 460, the process proceeds to flag integrated hotspots as different levels based on their score indices. The process then terminates thereafter. More details regarding the look-up table approach are discussed below with reference to FIG. 13.

Figure 5:
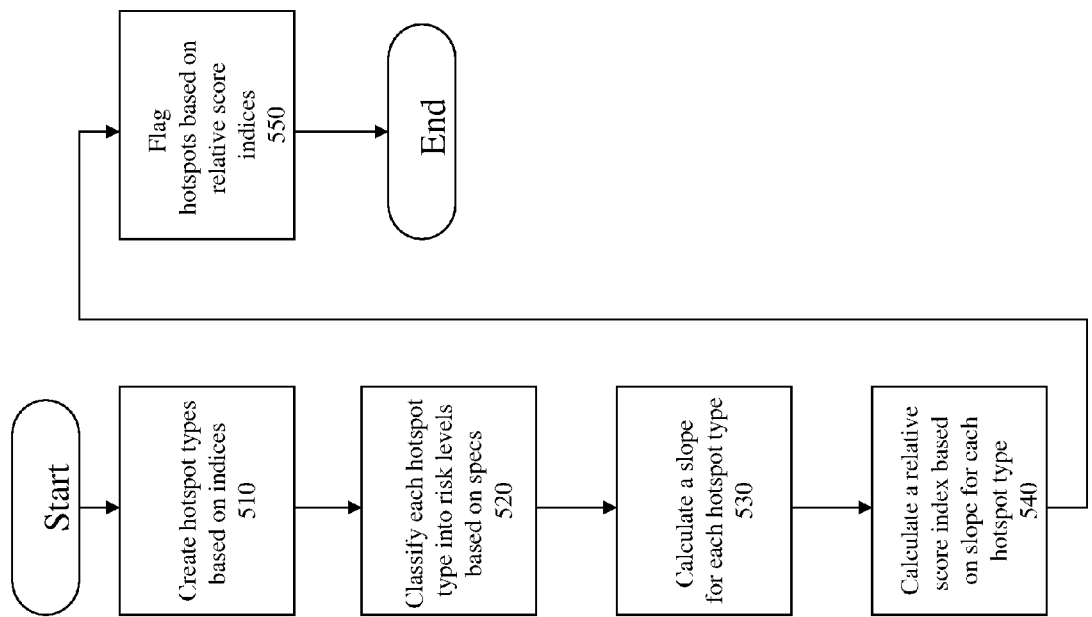
FIG. 5 is a flowchart of an interpolation approach.

FIG. 5 is a flowchart of an interpolation approach. At step 510, the process begins to create hotspot types based on the derived indices. At step 520, the process proceeds to classify each hotspot type into risk levels based on specifications of the pattern type. At step 530, the process proceeds to calculate a slope for each hotspot type. At step 540, the process proceeds to calculate a relative score index for each hotspot type based on the slope. At step 550, the process proceeds to prioritize integrated hotspots based on the relative score indices. The process then terminates thereafter. More details regarding the interpolation approach are discussed below with reference to FIG. 14.

FIG. 6 illustrates formulas for deriving normalized intensity log slope (NILS) and positions in the wafer pattern for evaluating NILS. An intensity log slope (ILS) 610 is first derived based on an intensity curve 620. The intensity curve 620 represents the sensitivity of a wafer pattern to the intensity of energy exposure. Thus, the intensity curve 620 is pattern-dependent. The intensity curve 620 may be generated from the DDK. The intensity log slope (ILS) may be derived from equation 610, which indicates the change in exposure energy relative to a change in critical dimension of the pattern. Once the ILS is derived, a normalized intensity log slope (NILS) is derived for different positions of the wafer pattern that are under evaluation.

In this illustrative example, three positions are under evaluation: ILS1, ILS2 and ILS3. Each of the positions is located on a different edge of the wafer pattern. Since ILS2 is located on an edge that is different from the rest of the edges in the pattern, ILS2 is most susceptible to a change in exposure energy. For each position under evaluation, a NILS_CD, a NILS_SP, or a combination thereof is derived. NILS_CD is the NILS value of the target line derived from formula 630. Formula 630 multiplies the ILS derived by a retarget_CD. Retarget_CD is the true line width of the target line as compared to the original_CD, which is the true line width of the original line.

NILS_SP is the NILS value of the target space derived from formula 640. Formula 640 multiples the ILS derived by a retarget_SP. Retarget_SP is the true line width of the target space between two positions. In this example, four values are determined based on the three positions: NILS_SP1, which is determined by multiplying ILS derived from ILS1 with retarget_SP; NILS_SP2, which is determined by multiplying ILS derived from ILS2 with retarget_SP; NILS_CD2, which is determined by multiplying ILS derived from ILS2 with retarget_CD; and NILS_CD3, which is determined by multiplying ILS derived from ILS3 with retarget_CD. These NILS values are later used in the integrated hotspot scoring system to identify hotspots.

FIG. 7 illustrates formulas for deriving depth of focus (DOF) using a basic estimation approach. In the basic estimation approach, DOF values are estimated based on three defocus conditions: f0, +df and −df. f0 represents nominal condition. df represents the defocus value. For each position under evaluation, DOF_CD, DOF_SP, or a combination thereof is derived. DOF_CD is the DOF value of the target line derived from formula 710. DOF_SP is the DOF value of the target space derived from formula 720. As discussed above, retarget_CD is the true line width of the target line. Retarget_SP is the true line width of the target space. CD_tor is the CD tolerance that is defined for the process window. SP_tor is the space tolerance that is defined for the process window. The default value for CD_tor is 10% of the retarget_CD. The default value for SP_tor is 10% of the retarget_SP. $CD_{f0}$ is the contour CD at the nominal condition, while $SP_{f0}$ is the space at the nominal condition. $CD_{+df}$ is the contour CD at the +df condition, while $SP_{+df}$ is the space at the +df condition. $Cd_{-df}$ is the contour CD at the −df condition and the $SP_{-df}$ is the space at the −df condition. These DOF values are also used in the integrated hotspot scoring system to identify hotspots.

Figure 8:
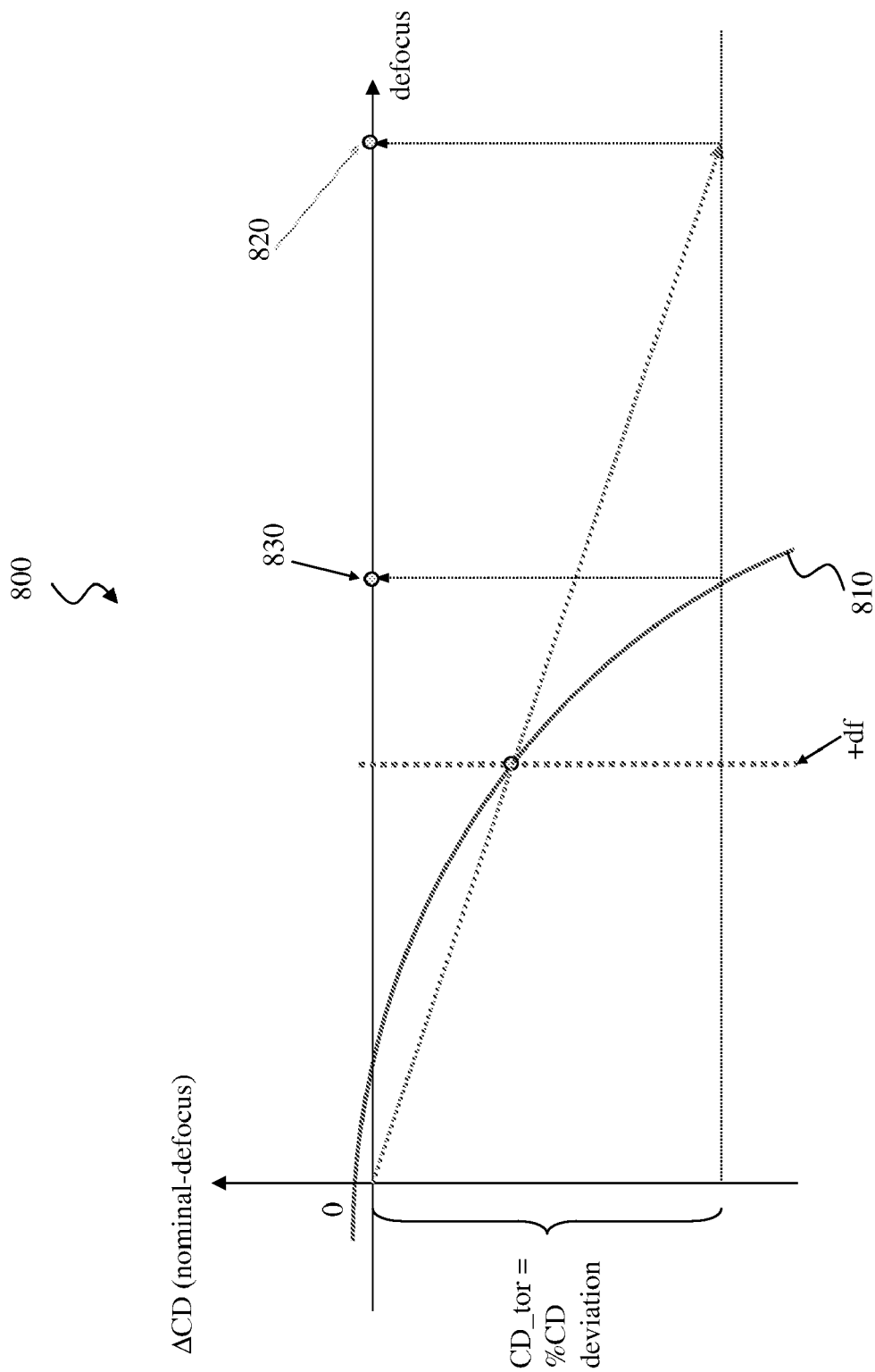
FIG. 8 is a graph illustrating the basic estimation approach for estimating DOF_CD values.

FIG. 8 is a graph illustrating the basic estimation approach for estimating DOF_CD values. Graph 800 is a graphic representation of formula 710 in FIG. 7. Graph 800 includes an X-axis indicating the defocus values and a Y-axis indicating the change in contour CD at f0 (nominal condition). Curve 810 indicates the change in contour critical dimension relative to the change in defocus value. With curve 810 and +df defocus, a linear estimation of DOF_CD can be made. In this example, DOF_CD is estimated at defocus 820, while the real DOF_CD is located at defocus value 830. In addition to formula 710, the graphic representation of formula 720 in FIG. 7 is also similar to graph 800.

FIG. 9 illustrates formulas for deriving depth of focus (DOF) using an advanced estimation approach. In the advanced estimation approach, formula 910 is used to estimate the DOF_CD values. Formula 910 may also be used to estimate the DOF_SP values if the CD values are replaced with SP values. In formula 910, the parameters are defined as follows:

df is the defocus value.
df_slope is determined from formula 920.
df_slope_mean is an average value of multiple df-slopes, based on a process.
df_dCD is derived from dividing the target CD by the CD difference between a nominal condition and the current default defocus condition.
CD_tor is the contour CD tolerance that is defined for the process window. The default value for CD_tor is 10% of the target CD.
$\Delta CD_{+df}$ is derived from dividing the target CD by the CD difference between the nominal condition and the +df defocus.
$\Delta CD_{-df}$ is derived from dividing the target CD by the CD difference between the nominal condition and the −df defocus.

Figure 10:
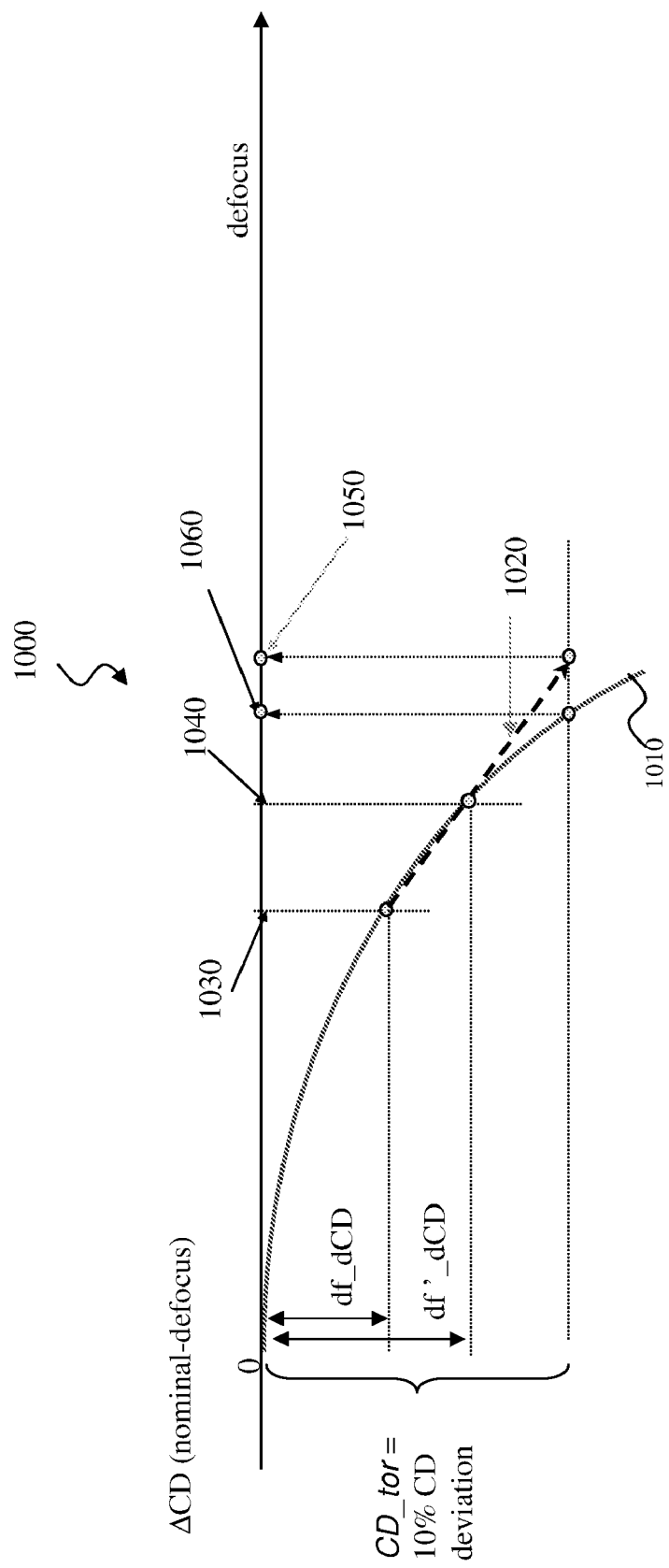
FIG. 10 is a graph illustrating the advanced estimation approach for estimating DOF_CD values.

FIG. 10 is a graph illustrating the advanced estimation approach for estimating DOF_CD values. Graph 1000 includes an X-axis indicating the defocus values and a Y-axis indicating the change in contour CD at f0 (nominal condition). Curve 1010 indicates the change in contour critical dimension relative to the change in defocus value. A linear line 1020 is estimated based on CD difference between default df condition 1030 and defocus df' 1040. The slope of linear estimated line 1020 is df_slope. With the advanced estimation approach, DOF_CD is estimated at defocus 1050, which is closer to the real DOF_CD located at defocus value 1060 than DOF_CD estimated in the basic estimation approach.

Figure 12:
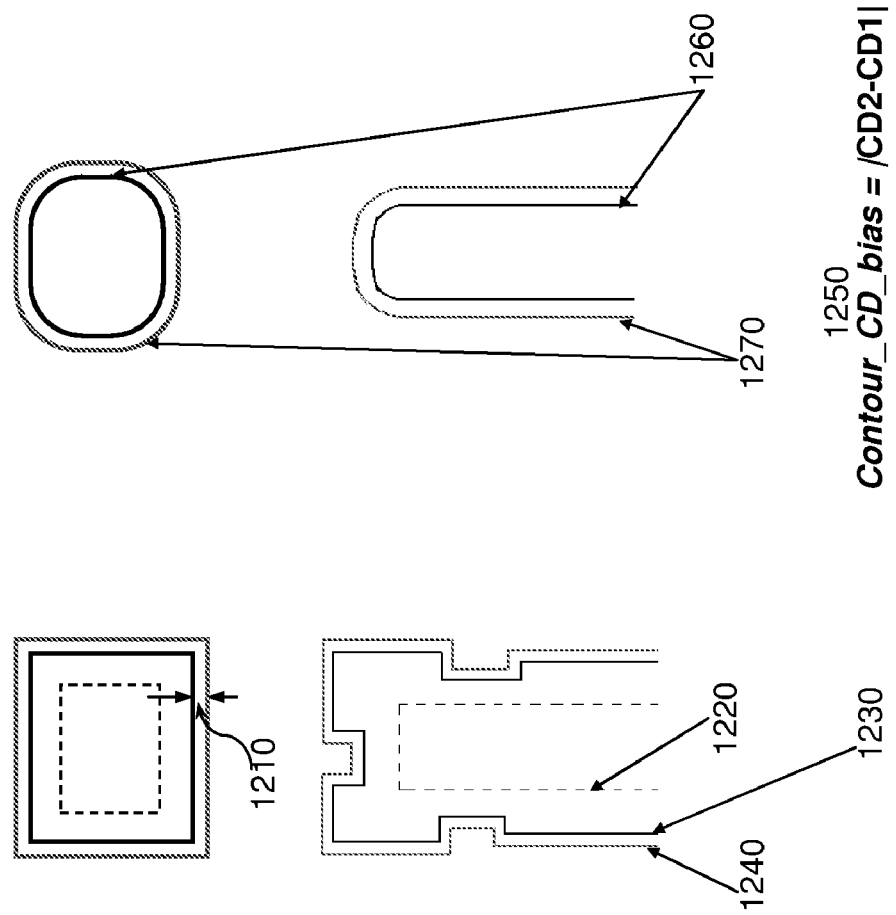
FIG. 12 illustrates the mask_edge_bias and the Contour_CD_bias.

FIG. 11 illustrates a formula for deriving mask error enhancement factor (MEEF). MEEF is determined using formula 1110 based on two factors: the Contour_CD_bias and the mask_edge_bias. FIG. 12 illustrates the mask_edge_bias and the Contour_CD_bias. Mask_edge_bias means biasing the post-OPC (optical proximity correction) layout by adding 2 nm outward from each side of the layout. For example, layout 1220 is the target layout. Layout 1230 is the layout after optical proximity correction. Layout 1230 is then biased by adding 2 nm to each side of the layout to form the mask_edge bias 1240. Contour_CD_bias 1250 is the absolute CD difference between CD2 and CD1. CD1 is the contour of the original post-OPC feature 1260. CD2 is the contour of the biased post-OPC feature 1270. Once the mask_edge_bias and Contour_CD_bias are determined, the MEEF index may be derived using formula 1110.

Based on the NILS, DOF, and MEEF indices, an aspect of the present disclosure provides an integrated hotspot scoring system that analyzes the three indices and identify weak area or hotspots. The hotspots may be categorized into three types are "NILS", "DOF", and "MEEF". Each hotspot type may be classified into two or more levels such as level1 for high risk hotspots and level2 for lower risk hotspots. A weighting score index may be assigned to each hotspot level. In another example, risk level may be scaled into a risk parameter defined in a range. Practically, more than one hotspot may be found at the same layout position. Therefore, an integrated hot-spot is generated for designers to easily review the DFM result and to clearly catch the risk levels of the hotspot.

The integrated hotspot may be defined as a score index or as a sum of the NILS score index, DOF score index, and MEEF score index. The integrated hotspots may be classified into two or more categories, for example, "non-line-end type", and "line-end type". The "line-end" type hotspots encounter more process issues compared to the "non-line-end-type" hotspots. The integrated hotspots are classified into categories due to the different score index calculations required for different types of integrated hotspots. Other categories may also be used to classify the integrated hotspots without departing from the spirit and scope of the present disclosure. In addition, each category of the integrated hotspots may be further classified into various levels based on the score indices, for example, from level 1 to level 3.

In an illustrative embodiment, the integrated hotspots scoring may be performed using a look-up table approach. The look-up table approach may be implemented within the DFM utilities 130. FIG. 13 illustrates an exemplary lookup table approach of the integrated hotspot scoring system. A look-up table 1300 is generated, which comprises the hotspot types created based on the three indices (NILS, DOF, and MEEF) 1320, the hotspot level definitions for different risk levels of the three hotspot types 1330, a weighted score index assigned to each risk level 1340, and an integrated hotspot combination 1350.

The hotspot level definitions for different risk levels of the three hotspot types 1330 may be based on hotspot criteria as specified in specifications, such as, spec A and spec B. The specifications may be different for different pattern type. For example, the specifications of a "line-end type" pattern may be different from the specifications of the "non line-end type" pattern. Table 1310 illustrates the hotspot criteria for each of the three hotspot types for spec A and spec B. For example, NILS criteria for spec A is 1.5, while NILS criteria for spec B is 2.5. Based on the hotspot criteria, risk levels of the hotspot type are defined. For example, level 1 of NILS hotspot type is defined as less than or equal to NILS criteria for spec A. Level 2 of NILS hotspot type is defined as less than or equal to NILS criteria for spec B, but greater than NILS criteria for spec A. The weighted score index 1340 is assigned to each of the risk levels of the three hotspot types. For example, a weighted score index of 8 is assigned to level 1 of NILS hotspot type and a weighted score index of 2 is assigned to level 2 of NILS hotspot type.

The integrated hotspot combination 1350 illustrate the distribution of hotspots based on the NILS, DOF, and MEEF indices. In this example, there are 26 positions under evaluation and each position comprises one or more hotspots based on the three indices derived. For example, g1 has a NILS index that is less than or equal to NILS criteria for spec A. Thus, a '1' is marked to identify the hotspot. Once the lookup table 1300 is generated, an integrated hotspot is generated by calculating a score index 1360 for each of the hotspots. The score index 1360 is a sum of the NILS score index, DOF score index, and MEEF score index.

For example, integrated hotspot g7 has a level 1 NILS hotspot and a level 1 DOF hotspot. The weighted score index of level 1 NILS hotspot is 8 and the weighted score index of level 1 DOF hotspot is 5. Therefore, the score index of integrated hotspot for g7 is 13, which is the sum of NILS score index and DOF score index. In another example, integrated hotspot g8 has a level 1 NILS hotspot and a level 2 DOF hotspot. The weighted score index of level 1 NILS hotspot is 8 and the weighted score index of level 2 DOF hotspot is 2. Therefore, the score index of integrated hotspot for g8 is 10, which is the sum of NILS score index and DOF score index.

Once the score index of integrated hotspot 1360 is calculated, the integrated hotspots are classified based on the number of integrated hotspots for each score index. Table 1370 comprises score indices from 0 to 15 and the number of integrated hotspots for each score index. For example, two integrated hotspots have a score index of 10 and one integrated hotspot has a score index of 13. Also in table 1370, the integrated hotspots are flagged for different levels based on their score indices. In this example, score indices 8 and 9 are flagged as level 3 hotspots. Score indices 10, 11, and 12 are flagged as level 2 hotspots. Score indices 13, 14, and 15 are flagged as level 1 hotspots. Level 1 hotspots are high risk hotspots. Based on these levels, designers may identify whether a design layout contains problem areas or hotspots that are unfriendly for manufacturing. In addition, designers may modify the design layout based on these levels to avoid future hotspots.

Figure 14:
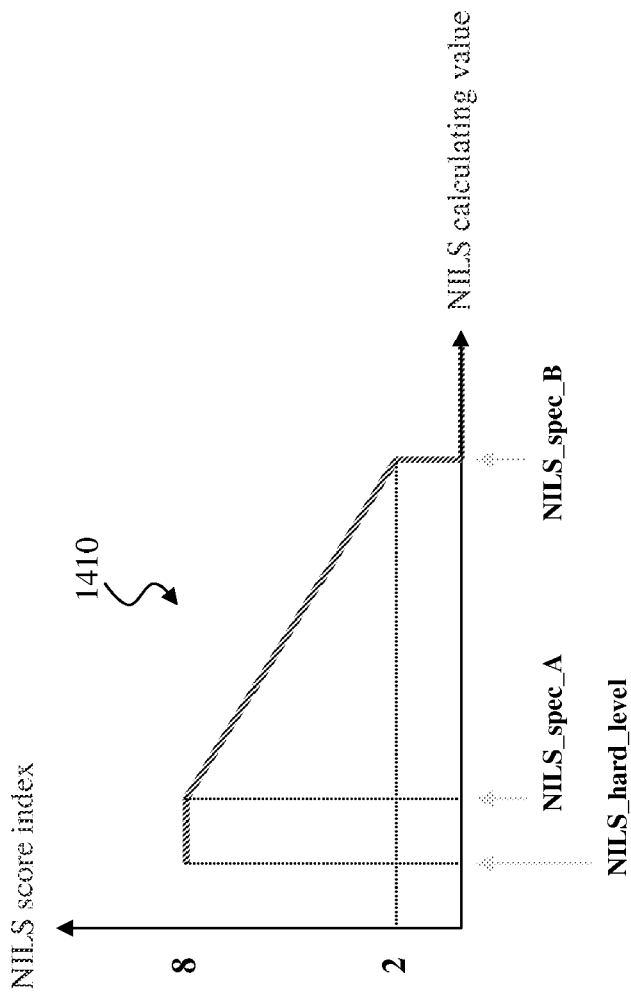
FIG. 14 illustrates formulas and a graph of an exemplary implementation of the interpolation approach.

In another illustrative embodiment, the integrated hotspots scoring may be performed using an interpolation approach. The interpolation approach may be implemented within the DFM utilities 130. In the interpolation approach, risk levels of each hotspot type may be scaled into a risk parameter defined in a range. FIG. 14 illustrates formulas and a graph of an exemplary implementation of the interpolation approach. As shown in graph 1410, the hotspot level definitions for different risk levels of the three hotspot types may be based on hotspot criteria as specified in specifications, such as spec A and spec B. If the NILS value of an integrated hotspot is less than the NILS_hard_level, the integrated hotspot should be flagged level 1 hotspot immediately, because the NILS value falls outside of the specifications. If the NILS value of an integrated hotspot falls within the NILS criteria for spec A and spec B, a slope_NILS is calculated using formula 1420.

As shown on the Y-axis of graph 1410, the range of the score index is from 2 to 8. The NILS values of spec A and B are indicated on the X-axis of graph 1410. In formula 1420, Slope_NILS is calculated by dividing the difference between the NILS values of spec A and B by the range of the score index. For example, the NILS value of spec B is 1.85 and the NILS value of spec A is 1.45. The difference between the NILS values is 0.4. The range of score index is −6. Thus, the slope_NILS is equal to −6/(0.4), which is −15. A relative NILS score index of an integrated hotspot is then calculated based on slope_NILS using formula 1430. Following the previously example, if the NILS value of an integrated hotspot is 1.53, the relative NILS score index is equal to 8-15*(1.53−1.45), which equals to 6.8. The relative NILS score index is the risk parameter defined in the range. Designers may identify whether a design layout contains problem areas or hotspots that are unfriendly for manufacturing based on this risk parameter. In addition, designers may modify the design layout based on the relative score indices to avoid future hotspots.

In summary, aspects of the present disclosure provide a method for detection and scoring of hot spots in a design layout. An aspect of the present disclosure provides a model-based approach to identify weak points of the circuit design layout. The model based approach includes deriving three model-based indices that are sensitive to process variations. An integrated hotspot scoring system is the provided that analyzes the three model-based indices and uses various approaches to identify hotspots. In this way, designers may use the results of the scoring system to prioritize weak points or hotspots of the design layout and modify the design layout based on the severity or risk levels of the hotspots.

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A computer program product that includes a computer-readable medium, the medium having stored thereon a sequence of instructions which, when executed by a processor, causes the processor to execute a method, the method comprising:
    receiving a design layout;
    deriving a plurality of indices for the design layout;
    creating a plurality of hotspot types based on the plurality of indices;
    classifying each of the plurality of hotspot types into a plurality of risk levels based on specifications of a pattern type of the design layout;
    calculating a slope for each of the plurality of hotspot types; and
    providing to a user a visual review prioritization of the plurality of hotspot types based on the slope.

2. The computer program product of claim 1, wherein the interpolation approach further comprises:
    calculating a relative score based on the slope for each of the plurality of hotspot types;
    assigning a risk level to at least one hotspot in the layout based on the relative score.

3. The computer program product of claim 2, further comprising: modifying the design layout based on risk levels of the at least one hotspot.

4. The computer program product of claim 1, wherein deriving a plurality of indices comprises:
    deriving an intensity curve;
    deriving an intensity log slope (ILS) indicating a change in exposure energy relative to a change in critical dimension; and
    deriving a normalized intensity log slope (NILS) based on the intensity log slope.

5. The computer program product of claim 4, wherein deriving a normalized intensity log slope (NILS) comprises:
    multiplying the intensity log slope with a true line width of a target line in the design layout.

6. The computer program product of claim 4, wherein deriving a normalized intensity log slope (NILS) comprises:
    multiplying the intensity log slope with a true line width of a target space in the design layout.

7. The computer program product of claim 1, wherein deriving a plurality of indices comprises deriving a depth of focus index based on a basic estimation approach.

8. The computer program product of claim 7, wherein deriving a depth of focus (DOF) index based on a basic estimation approach comprises:
    deriving a depth of focus (DOF) value of a target line in the design layout based on a defocus value, a true line width of the target line, a contour critical dimension at a nominal defocus condition, a contour critical dimension at a +df defocus, a contour critical dimension at a −df defocus, and a critical dimension tolerance defined for a process window.

9. The computer program product of claim 7, wherein deriving a depth of focus (DOF) index based on a basic estimation approach comprises:
    deriving a depth of focus (DOF) value of a target space in the design layout based on a defocus value, a true line width of the target space, a space at a nominal defocus condition, a space at a +df defocus, a space at a −df defocus, and a space tolerance defined for a process window.

10. The computer program product of claim 1, wherein deriving a plurality of indices comprises deriving a depth of focus index based on an advanced estimation approach.

11. The computer program product of claim 10, wherein deriving a depth of focus index based on an advanced estimation approach comprises:
    deriving a depth of focus (DOF) value of a target line based on a defocus value, a slope derived from a slope mean and a difference in critical dimension between nominal condition and current default defocus condition, a contour CD tolerance defined for the process window, a difference in critical dimension between the nominal condition and the +df defocus, and a difference in critical dimension between the nominal condition and the −df defocus.

12. The computer program product of claim 1, wherein deriving a plurality of indices comprises deriving a mask error enhancement factor (MEEF) index based on a contour critical dimension bias and a mask edge bias.

13. The computer program product of claim 12, wherein the contour critical dimension bias is derived by adding 2 nm to each side of the design layout after optical proximity correction.

14. The computer program product of claim 12, wherein the mask edge bias is derived by taking an absolute value of a difference in critical dimension between the design layout after optical proximity correction and a biased design layout after optical proximity correction.

15. The computer program product of claim 1, wherein deriving the plurality of indices comprises:
    deriving a first index sensitive to energy exposure of the design layout;
    deriving a second index sensitive to process image formation; and
    deriving a third index sensitive to mask manufacturing error.

16. A method comprising:
    receiving a design layout;
    deriving a plurality of indices for the design layout;
    creating a plurality of hotspot types based on the plurality of indices;
    classifying each of the plurality of hotspot types into a plurality of risk levels based on specifications of a pattern type of the design layout;
    calculating a slope for each of the plurality of hotspot types;
    providing a visual review prioritization of the plurality of hotspot types based on the slope; and
    receiving an updated design layout in response to the visual review prioritization; and
    fabricating a mask based on the updated design layout.

* * * * *